(12) United States Patent
An

(10) Patent No.: US 10,263,140 B2
(45) Date of Patent: Apr. 16, 2019

(54) SEMICONDUCTOR LIGHT-EMITTING DEVICE AND METHOD FOR MANUFACTURING THE SAME

(71) Applicant: Sang Jeong An, Gyeonggi-do (KR)

(72) Inventor: Sang Jeong An, Gyeonggi-do (KR)

( * ) Notice: Subject to any disclaimer, the term of this patent is extended or adjusted under 35 U.S.C. 154(b) by 0 days.

(21) Appl. No.: 15/472,046

(22) Filed: Mar. 28, 2017

(65) Prior Publication Data
US 2017/0200854 A1    Jul. 13, 2017

Related U.S. Application Data

(62) Division of application No. 14/406,906, filed as application No. PCT/KR2013/005271 on Jun. 14, 2013, now abandoned.

(30) Foreign Application Priority Data

Jun. 14, 2012  (KR) .................. 10-2012-0063674
Jul. 26, 2012  (KR) .................. 10-2012-0081782

(51) Int. Cl.
*H01L 33/00*     (2010.01)
*H01L 33/62*     (2010.01)
(Continued)

(52) U.S. Cl.
CPC ...... *H01L 33/0079* (2013.01); *H01L 33/0075* (2013.01); *H01L 33/06* (2013.01);
(Continued)

(58) Field of Classification Search
None
See application file for complete search history.

(56) References Cited

U.S. PATENT DOCUMENTS 7,154,123 B2   12/2006  Kunisato et al. ............... 257/86
8,089,074 B2    1/2012  Kim et al. ...................... 257/79
(Continued)

FOREIGN PATENT DOCUMENTS

JP       2012-023375      2/2012    ............ H01L 33/38
KR   10-2007-0079956     8/2007    ............ H01L 33/36
(Continued)

OTHER PUBLICATIONS

International Search Report (ISR) dated Oct. 15, 2013 in International Patent Application No. PCT/KR2013/005271.
(Continued)

*Primary Examiner* — Hoang-Quan T Ho
(74) *Attorney, Agent, or Firm* — Harness, Dickey & Pierce, P.L.C.

(57) ABSTRACT

The disclosed invention relates to a semiconductor light-emitting element comprising: a plurality of semiconductor layers which are provided with a growth substrate eliminating surface on the side where a first semiconductor layer is located; a support substrate which is provided with a first electrical pathway and a second electrical pathway; a joining layer which joins a first surface side of the support substrate with a second semiconductor layer side of the plurality of semiconductor layers, and is electrically linked with the first electrical pathway; a joining layer eliminating surface which is formed on the first surface, and in which the second electrical pathway is exposed, and which is open towards the plurality of semiconductor layers; and an electrical link for electrically linking the plurality of semiconductor layers with the second electrical pathway exposed in the joining layer eliminating surface.

4 Claims, 10 Drawing Sheets

(51) Int. Cl.
*H01L 33/38* (2010.01)
*H01L 33/32* (2010.01)
*H01L 33/06* (2010.01)

(52) U.S. Cl.
CPC ............ *H01L 33/32* (2013.01); *H01L 33/382* (2013.01); *H01L 33/385* (2013.01); *H01L 33/62* (2013.01); *H01L 33/007* (2013.01); *H01L 2224/16* (2013.01); *H01L 2933/0016* (2013.01); *H01L 2933/0033* (2013.01)

(56) References Cited

U.S. PATENT DOCUMENTS

| | | | |
|---|---|---|---|
| 8,525,216 B2 | 9/2013 | Chen et al. | 257/99 |
| 8,604,491 B2* | 12/2013 | Yu | H01L 33/0079 257/698 |
| 8,653,542 B2 | 2/2014 | Hsia et al. | 257/88 |
| 9,076,898 B2* | 7/2015 | Herrmann | H01L 33/382 |
| 2002/0024053 A1 | 2/2002 | Inoue et al. | 257/79 |
| 2003/0086463 A1 | 5/2003 | Shin et al. | 372/46 |
| 2005/0199891 A1 | 9/2005 | Kunisato et al. | 257/85 |
| 2008/0029761 A1* | 2/2008 | Peng | H01L 33/486 257/43 |
| 2008/0142817 A1* | 6/2008 | Ibbetson | H01L 33/486 257/88 |
| 2008/0211400 A1 | 9/2008 | Kim et al. | 313/506 |
| 2009/0173963 A1 | 7/2009 | Hsu et al. | 257/99 |
| 2010/0096652 A1 | 4/2010 | Choi et al. | 257/98 |
| 2010/0171135 A1* | 7/2010 | Engl | H01L 33/382 257/98 |
| 2011/0140078 A1 | 6/2011 | Hsu et al. | 257/13 |
| 2011/0149078 A1 | 6/2011 | Fan et al. | 348/152 |
| 2011/0180831 A1 | 7/2011 | Song | 257/98 |
| 2011/0204390 A1 | 8/2011 | Lerman et al. | 257/88 |
| 2012/0007120 A1 | 1/2012 | Kim et al. | 257/98 |
| 2012/0025222 A1 | 2/2012 | Chen et al. | 257/88 |
| 2012/0119249 A1* | 5/2012 | Kim | H01L 33/62 257/99 |
| 2012/0181568 A1 | 7/2012 | Hsia et al. | 257/99 |
| 2012/0313122 A1 | 12/2012 | Nakayama et al. | 257/88 |
| 2013/0256735 A1* | 10/2013 | Kim | H01L 33/62 257/99 |
| 2015/0144870 A1* | 5/2015 | An | H01L 33/382 257/13 |

FOREIGN PATENT DOCUMENTS

| | | | |
|---|---|---|---|
| KR | 10-2011-0082863 | 7/2011 | H01L 33/02 |
| KR | 10-2012-0052036 | 5/2012 | H01L 33/36 |

OTHER PUBLICATIONS

Office Action (Non-final) dated Apr. 12, 2016, issued in U.S. Appl. No. 14/406,906.

Office Action (Final) dated Sep. 29, 2016, issued in U.S. Appl. No. 14/406,906.

* cited by examiner

Prior Art

SEMICONDUCTOR LIGHT-EMITTING DEVICE AND METHOD FOR MANUFACTURING THE SAME

CROSS-REFERENCE TO RELATED APPLICATIONS

This application is a divisional application of Ser. No. 14/406,906, filed 10 Dec. 2014, which is a national phase application of PCT Application No. PCT/KR2013/005271, filed on 14 Jun. 2013, which claims the benefit and priority to Korean Patent Application No. 10-2012-0063674, filed 14 Jun. 2012 and to Korean Patent Application No. 10-2012-0081782, filed 26 Jul. 2012. The entire disclosures of the applications identified in this paragraph are incorporated herein by references.

TECHNICAL FIELD

The present disclosure relates generally to a semiconductor light emitting device or element and a method for manufacturing the same. More specifically, the present disclosure related to a semiconductor light emitting device having electrical passes on a supporting substrate, and a method for manufacturing the same.

Within the context herein, the term "semiconductor light emitting device" is intended to refer to a semiconductor light emitting device that generates light via electron-hole recombination, and the typical example thereof is a group III-nitride semiconductor light emitting device. The group III-nitride semiconductor is composed of $Al_{(x)}Ga_{(y)}In_{(1-x-y)}N$ (wherein, $0 \leq x \leq 1$, $0 \leq y \leq 1$, $0 \leq x+y \leq 1$). Another example thereof is a GaAs-based semiconductor light emitting device used for red light emission.

BACKGROUND

This section provides background information related to the present disclosure which is not necessarily prior art.

FIG. 1 is a view illustrating one example of the semiconductor light emitting device (Lateral Chip) in the prior art, in which the semiconductor light emitting device includes a substrate 100, and a buffer layer 200, a first semiconductor layer 300 having a first conductivity, an active layer 400 for generating light via electron-hole recombination and a second semiconductor layer 500 having a second conductivity different from the first conductivity, which are deposited over the substrate 100 in the order mentioned, and additionally, a light-transmitting conductive film 600 for current spreading, and an electrode 700 serving as a bonding pad are formed thereon, and an electrode 800 serving as a bonding pad are formed on an etch-exposed portion of the first semiconductor layer 300.

FIG. 2 is a view illustrating another example of the semiconductor light emitting device (Flip Chip) in the prior art, in which the semiconductor light emitting device includes a substrate 100, and a first semiconductor layer 300 having a first conductivity, an active layer 400 for generating light via electron-hole recombination and a second semiconductor layer 500 having a second conductivity different from the first conductivity, which are deposited over the substrate 100 in the order mentioned, and additionally, three-layered electrode films for reflecting light towards the substrate 100, i.e., an electrode film 901, an electrode film 902 and an electrode film 903 are formed thereon, and an electrode 800 serving as a bonding pad is formed on an etch-exposed portion of the first semiconductor layer 300.

FIG. 3 is a view illustrating yet another example of the semiconductor light emitting device (Vertical Chip) in the prior art, in which the semiconductor light emitting device includes a first semiconductor layer 300 having a first conductivity, an active layer 400 for generating light via electron-hole recombination and a second semiconductor layer 500 having a second conductivity different from the first conductivity, which are deposited in the order mentioned, and additionally, a metal reflective film 910 for reflecting light towards the first semiconductor layer 300 is formed on the second semiconductor layer 500, and an electrode 940 is formed on the side of a supporting substrate 930. The metal reflective film 910 and the supporting substrate 930 are joined together by a wafer bonding layer 920. An electrode 800 serving as a bonding pad is formed on the first semiconductor layer 300.

FIG. 4 and FIG. 5 illustrate yet further examples of the semiconductor light emitting device in the prior art. As illustrated in FIG. 4, a semiconductor light emitting device (Flip Chip) as shown in FIG. 2 is mounted on a wiring board (1000), and then a substrate 100 is removed as shown in FIG. 5, thereby obtaining a semiconductor light emitting device (Vertical Chip; it is termed such to indicate the substrate 100 has been removed). In particular, this semiconductor light emitting device can be obtained by aligning electrode films 901, 902 and 903 and an electrode pattern 1010, followed by aligning an electrode 800 and an electrode pattern 1020. A semiconductor light emitting device is then mounted on the wiring board 1000, using a stud bump, paste or eutectic metals 950 and 960, and the substrate 100 is removed by means of a laser.

However, because the above process needs to be performed at the chip level, the process gets lengthy and complicated, and the alignment of the electrode films 901, 902 and 903, the electrode 800, and the electrode patterns 1010 and 1020 also creates difficulties. Apart from that, an increase in costs associated with the phosphor coating at the chip level adds another problem.

Therefore, while the commercialization of TFFC (Thin Film Flip Chip) technology at the chip level represents a high level manufacturing technology of semiconductor light emitting devices, on the other hand, it also openly manifests that the application of such technology at the wafer level is not yet made easy. Many suggestions have been made in order to apply this concept at the wafer level. Nevertheless, neither a semiconductor light emitting device nor a method for manufacturing the same was proposed, which can substantially overcome the difficulties in the alignment of electrode films 901, 902 and 903, the electrode 800 and the electrode patterns 1010 and 1020 and, after a wafer level bonding operation, the cracks in the semiconductor layers 200, 300 and 400 during the removal of the substrate 100 and in the subsequent processes.

TECHNICAL PROBLEM

The problems to be solved by the present disclosure will be described in the latter part of the best mode for carrying out the invention.

SUMMARY

This section provides a general summary of the disclosure and is not a comprehensive disclosure of its full scope or all of its features.

According to one aspect of the present disclosure, there is provided a semiconductor light emitting device, which comprises a plurality of semiconductor layers that grows sequentially on a growth substrate, with the plurality of semiconductor layers including a first semiconductor layer having a first conductivity and a growth substrate-removed surface being formed on the side thereof, a second semiconductor layer having a second conductivity different from the first conductivity, and an active layer interposed between the first semiconductor layer and the second semiconductor layer, generating light via electron-hole recombination; a supporting substrate having a first surface and a second surface opposite to the first surface, wherein a first electrical pass via which either electrons or holes are transferred to the plurality of semiconductor layers, and a second electrical pass via which either electrons or holes whichever have not been transferred via the first electrical pass are transferred to the plurality of semiconductor layers continue from the second surface to the first surface; a bonded layer, which bonds the second semiconductor layer side of the plurality of semiconductor layers to the first surface side of the supporting substrate and is electrically connected with the first electrical pass; a bonded layer-removed surface formed on the first surface, exposing the second electrical pass and being open towards the plurality of semiconductor layer; and an electrical connection for electrically connecting the plurality of semiconductor layers with the second electrical pass exposed on the bonded layer-removed surface such that either electrons or holes whichever have not been transferred via the first electrical pass are transferred to the plurality of semiconductor layers.

According to another aspect of the present disclosure, there is provided a method for manufacturing a semiconductor light emitting device, comprising the steps of: preparing a plurality of semiconductor layers that grows sequentially on a growth substrate, with the plurality of semiconductor layers including a first semiconductor layer having a first conductivity and a growth substrate-removed surface being formed on the side thereof, a second semiconductor layer having a second conductivity different from the first conductivity, and an active layer interposed between the first semiconductor layer and the second semiconductor layer, generating light via electron-hole recombination; preparing a supporting substrate having a first surface and a second surface opposite to the first surface, wherein a first electrical pass via which either electrons or holes are transferred to the plurality of semiconductor layers, and a second electrical pass via which either electrons or holes whichever have not been transferred via the first electrical pass are transferred to the plurality of semiconductor layers are provided; bonding the plurality of semiconductor layers side on the opposite side of the growth substrate with the first surface side of the supporting substrate, such that a bonded layer is formed on the bonded region and the first electrical pass is electrically connected to the plurality of semiconductor layers via the bonded layer; removing the substrate; removing the bonded layer so as to expose the second electrical pass; and electrically connecting the second electrical pass with the plurality of semiconductor layer such that either electrons or holes whichever have not been transferred via the first electrical pass are transferred to the plurality of semiconductor layers.

ADVANTAGEOUS EFFECTS

The advantageous effects of the present disclosure will be described in the latter part of the best mode for carrying out the invention.

DRAWINGS

FIG. 7 through FIG. 11 views illustrating one example of the method for manufacturing a semiconductor light emitting device according to the present disclosure.

Figure 12:
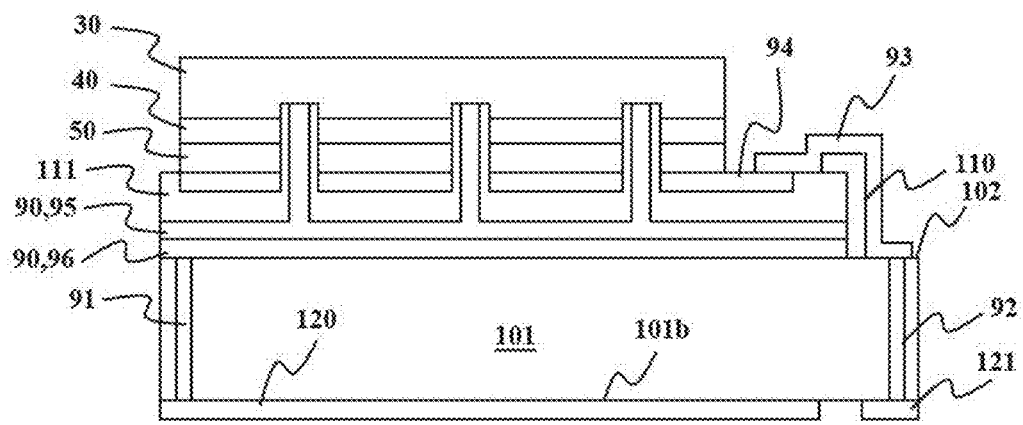

FIG. 12 is a view illustrating one example of the process of forming an electrical connection according to the present disclosure.

Figure 13:
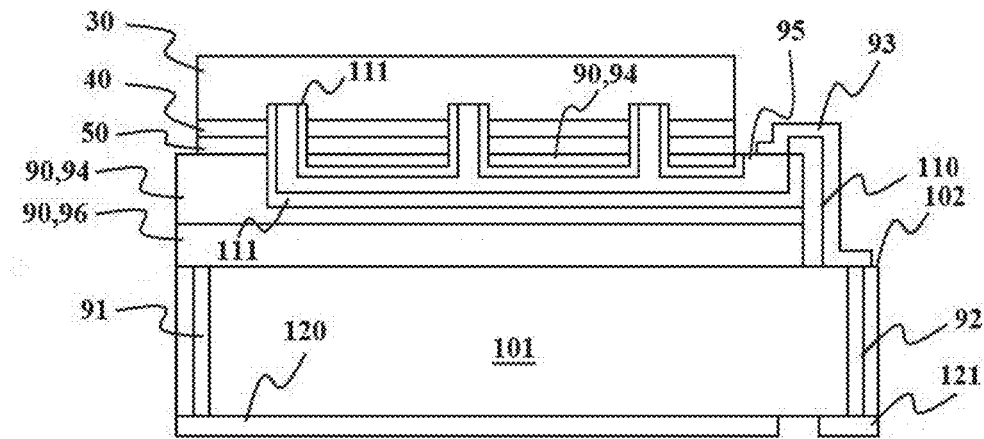

FIG. 13 is a view illustrating another example of the process of forming an electrical connection according to the present disclosure.

Figure 14:
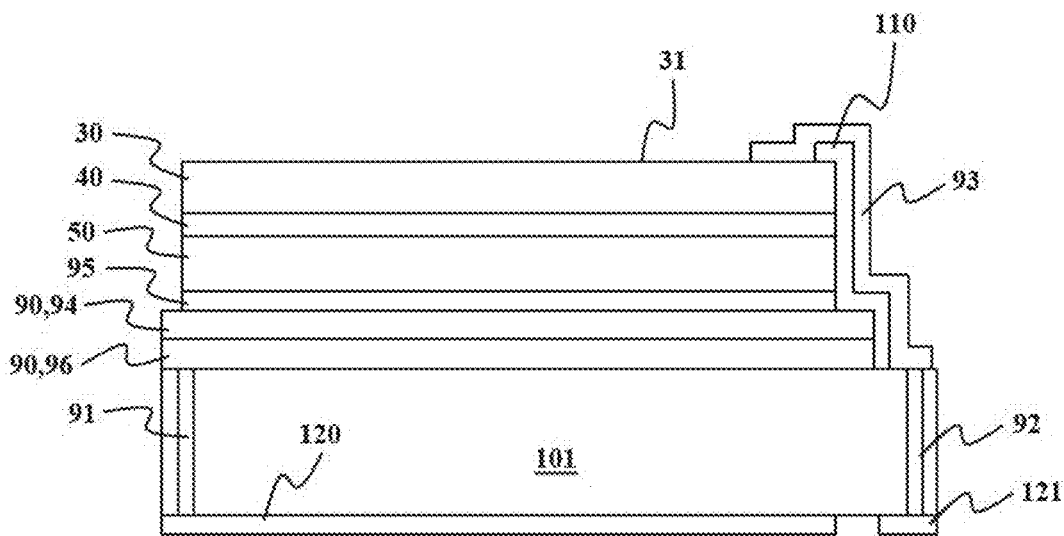

FIG. 14 is a view illustrating yet another example of the process of forming an electrical connection according to the present disclosure.

Figure 15:
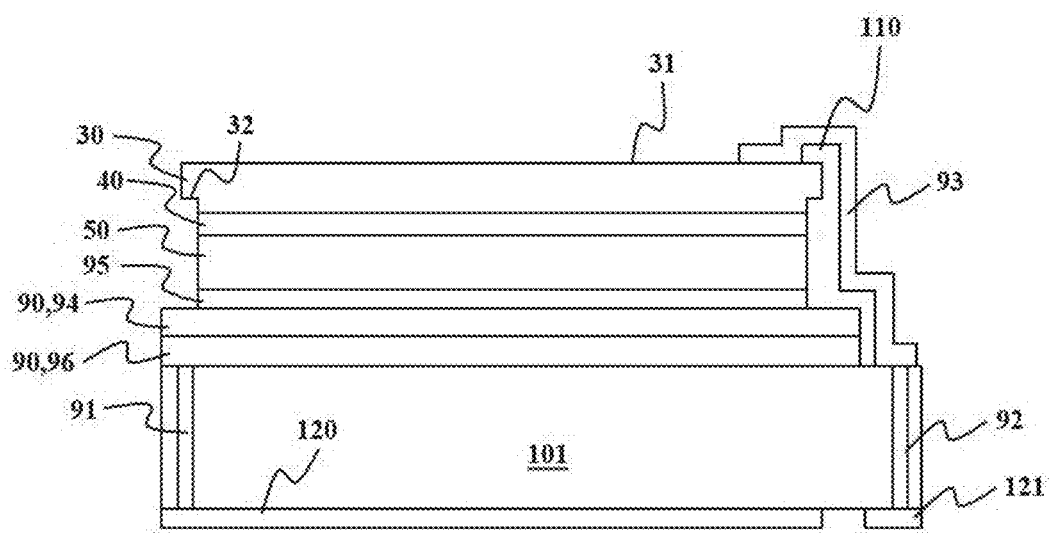

FIG. 15 is a view illustrating yet another example of the process of forming an electrical connection according to the present disclosure.

Figure 16:
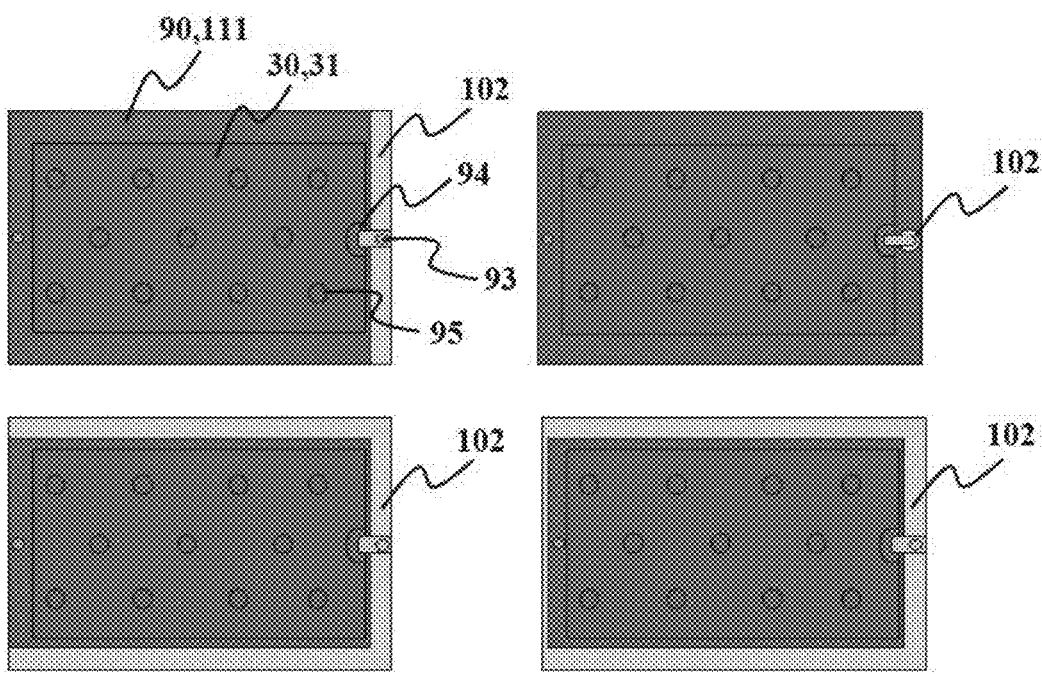

FIG. 16 is a view illustrating examples of the form of a growth substrate-removed surface in the semiconductor light emitting device shown in FIG. 12.

Figure 17:
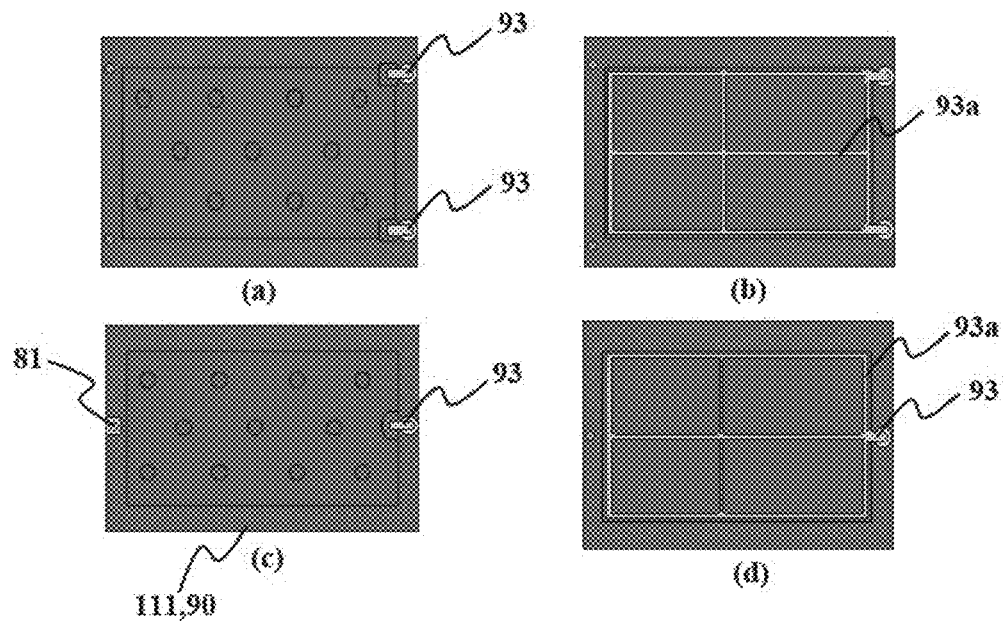

FIG. 17 is a view illustrating examples of the form of an electrical connection according to the present disclosure.

Figure 18:
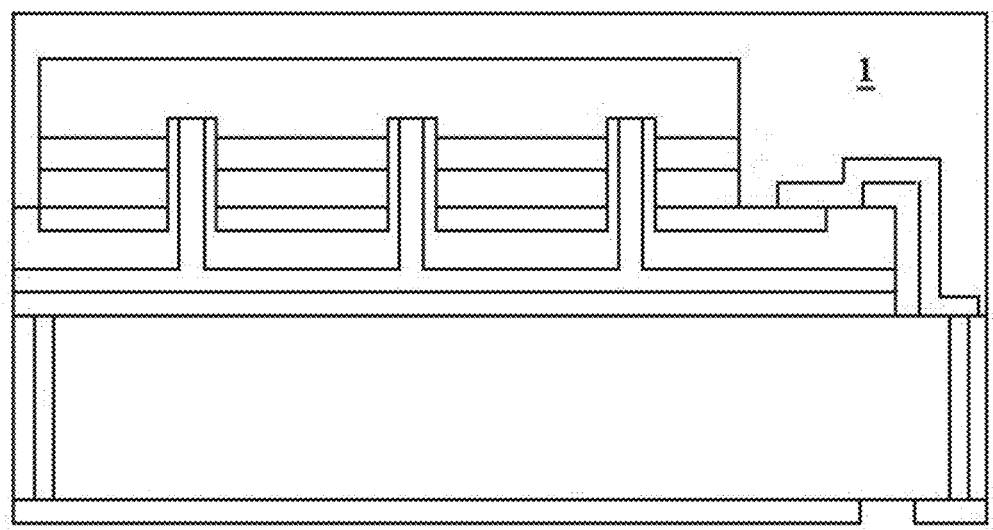
Figure 19:
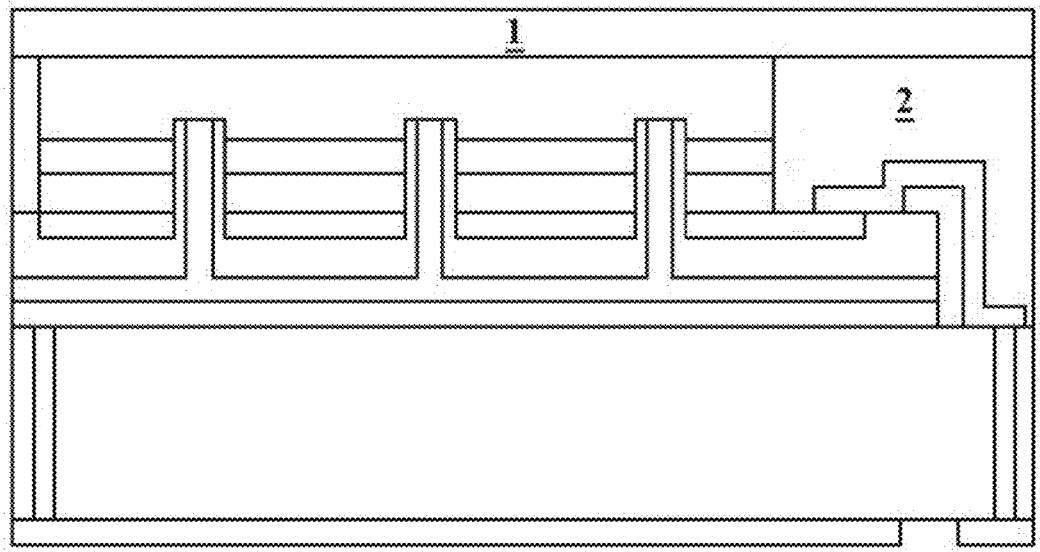
Figure 20:
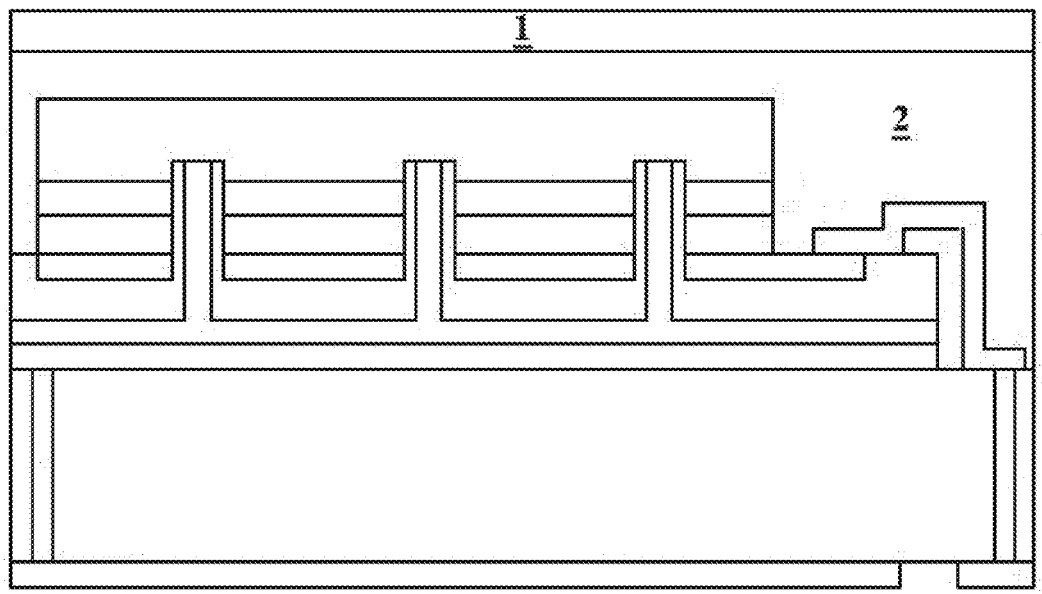

FIG. 18 through FIG. 20 are views illustrating examples of the application of a phosphor in the present disclosure.

DETAILED DESCRIPTION

Hereinafter, the present disclosure will now be described in detail with reference to the accompanying drawings.

Figure 1:
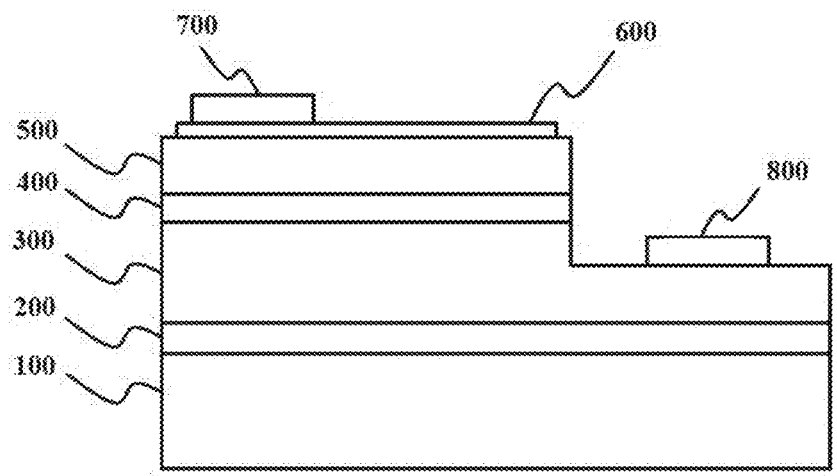
FIG. 1 is a view illustrating one example of a semiconductor light emitting device (Lateral Chip) in the prior art.
Figure 2:
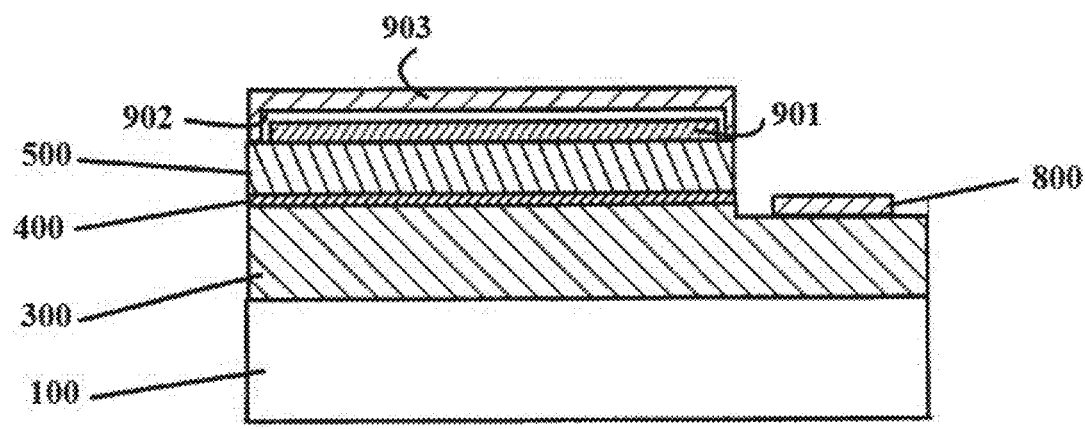
FIG. 2 is a view illustrating another example of a semiconductor light emitting device (Flip Chip) in the prior art.
Figure 3:
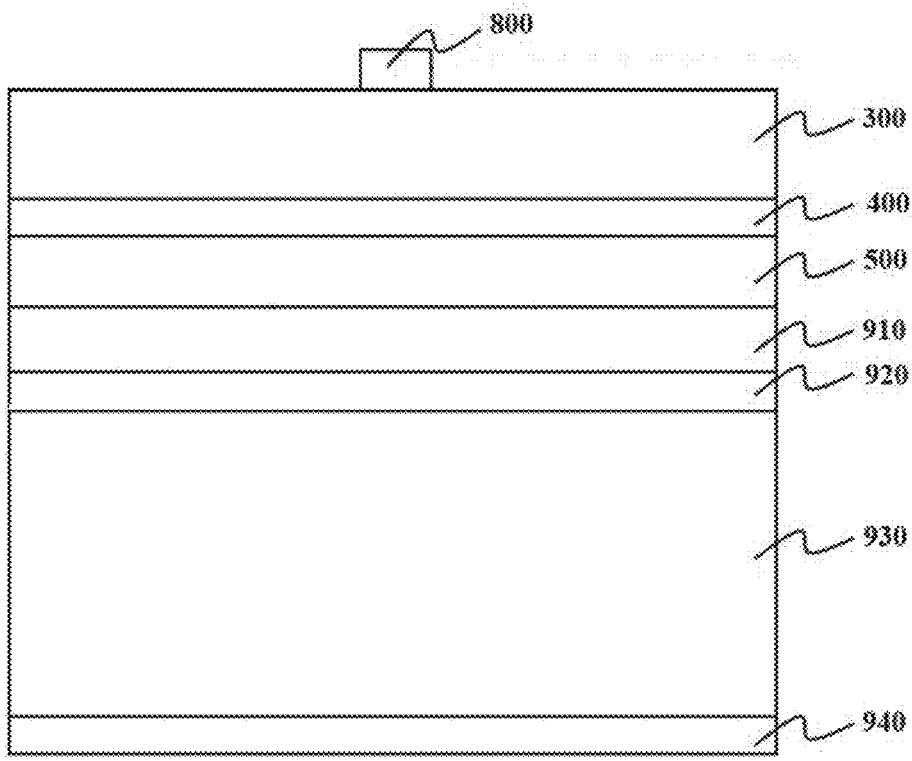
FIG. 3 is a view illustrating yet another example of a semiconductor light emitting device (Vertical Chip) in the prior art.
Figure 4:
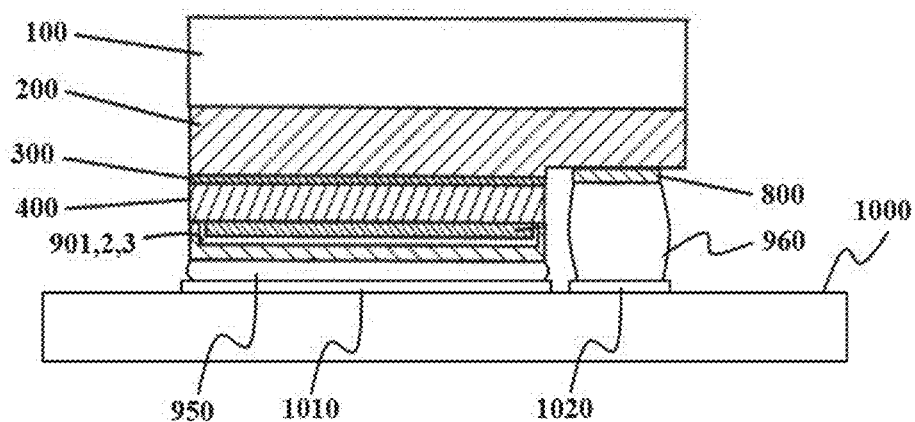
FIG. 4 and FIG. 5 are views illustrating yet further examples of a semiconductor light emitting device in the prior art.
Figure 5:
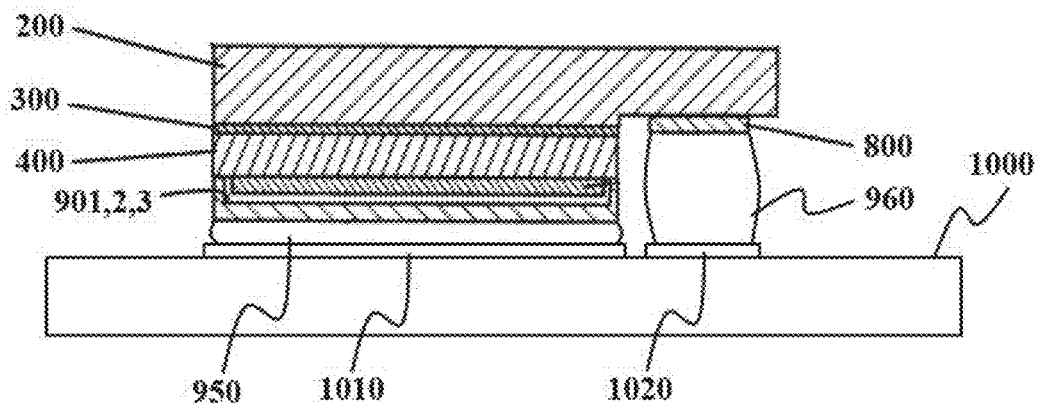
Figure 6:
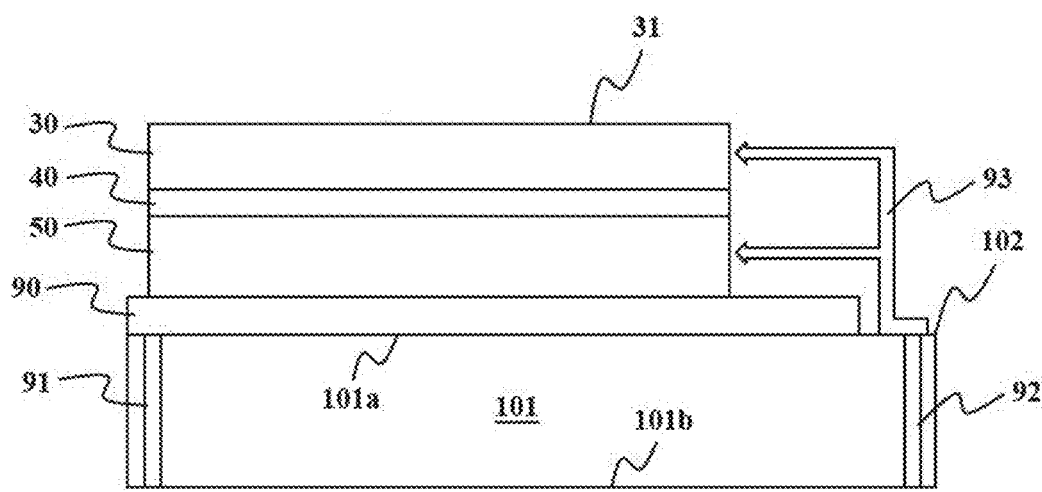
FIG. 6 is a view describing the technical concept of a semiconductor light emitting device according to the present disclosure.

FIG. 6 is a view describing the technical concept of a semiconductor light emitting device according to the present disclosure, in which the semiconductor light emitting device has a plurality of semiconductor layers which includes a first semiconductor layer 30 (e.g. n-type GaN) having a first conductivity, a second semiconductor layer 50 (e.g. p-type GaN) having a second conductivity different from the first conductivity, and an active layer 40 (e.g. InGaN/GaN multi-quantum well structure) interposed between the first semiconductor layer 30 and the second semiconductor layer 50, generating light via electron-hole recombination. The conductivity of the first semiconductor layer 30 and the conductivity of the second semiconductor layer 50 may be changed. The plurality of semiconductor layers 30, 40 and 50 has a growth substrate-removed surface 31 that is exposed by the removal of the growth substrate 10 (see FIG. 7). The growth substrate-removed surface 31 can be comprised of a doped n layer, an undoped n layer or a buffer layer 200 as in FIG. 1, depending on the conditions for the removal of the growth substrate and the sacrificial layer. It can also be a rough surface in order to increase the light extraction efficiency. Further, the semiconductor light emitting device has a supporting substrate 101 with a first surface 101a and a second surface 101b opposite to the first surface 101a. The supporting substrate 101 has a first electrical pass 91 and a second electrical pass 92. In FIG. 6, the first electrical pass 91 and the second electrical pass 92 continue from the second surface 101a to the first surface 101b. The plurality of semiconductor layers 30, 40 and 50 and the supporting substrate 101 are joined or bonded by a bonded layer 90. The bonded layer 90 can be formed by a conventional wafer bonding method that is employed in the manufacture of the semiconductor light emitting device as in FIG. 3. The first electrical pass 91 transfers either electrons or holes to the plurality of semiconductor layers 30, 40 and 50, via the bonded layer 90. By removing the bonded layer 90, the second electrical pass 92 is exposed on the first surface 101a. With the bonded layer 90 being removed, the second electrical pass 92 is open towards the plurality of the semiconductor layers 30, 40 and 50. This open, exposed area of the first surface 101a is defined as a bonded layer-removed surface 102. an electrical connection 93 can electrically connect the second electrical pass 92 to the first semiconductor layer 30 or to the second semiconductor layer 50.

Figure 7:
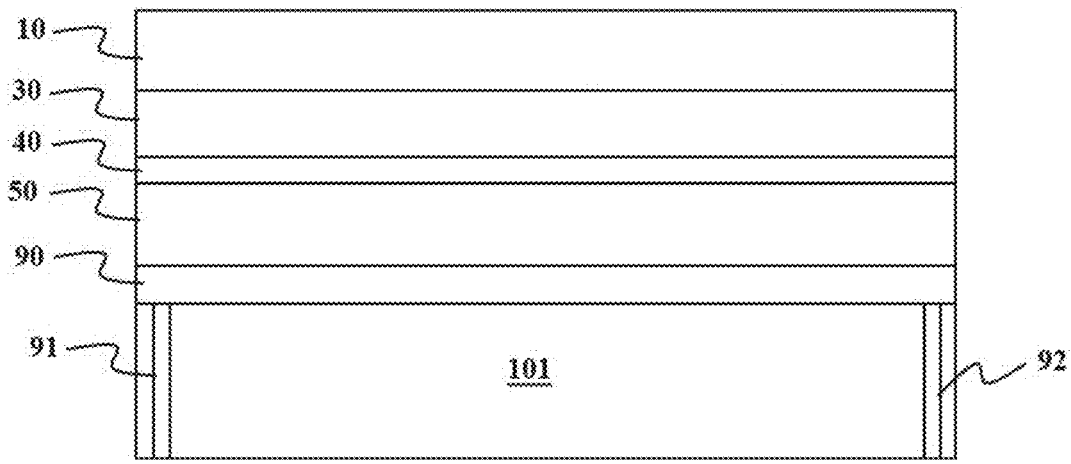
Figure 8:
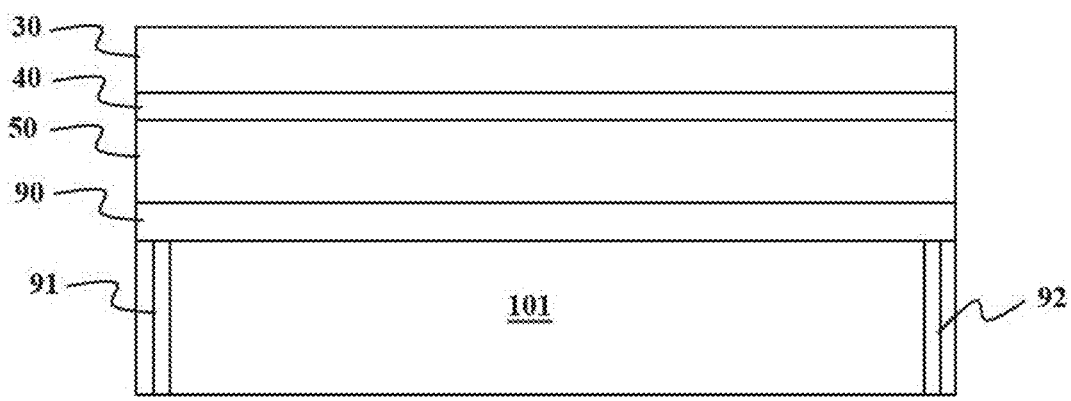
Figure 9:
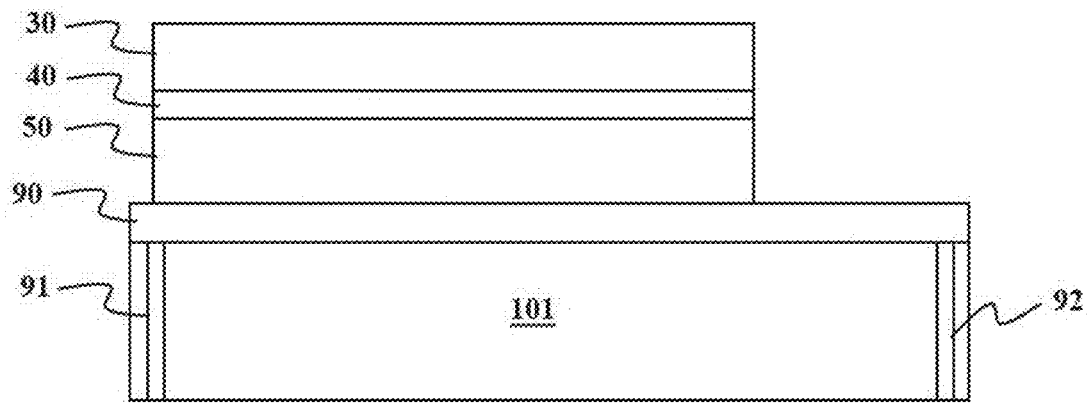
Figure 10:
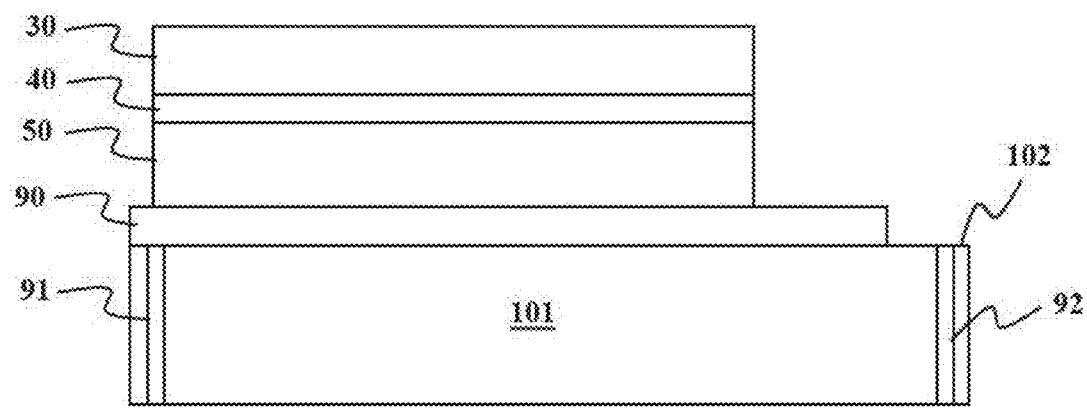
Figure 11:
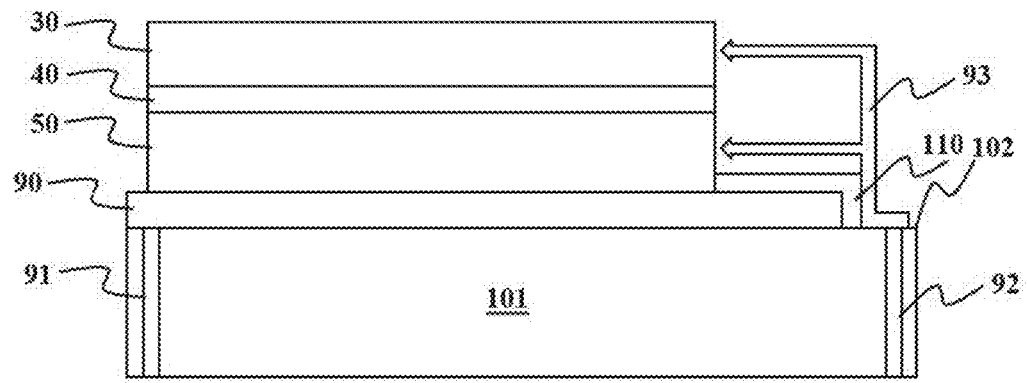

FIG. 7 through FIG. 11 views illustrating one example of the method for manufacturing a semiconductor light emitting device according to the present disclosure. Referring now to FIG. 7, a first semiconductor layer 30, an active layer 40 and a second semiconductor layer 40 that are sequentially grown on a growth substrate 10 (e.g. a sapphire substrate) are first bonded, via a bonded layer 90 having been formed, to a supporting substrate 101 where a first electrical pass 91 and a second electrical pass 92 are provided. Exemplary materials of the growth substrate 10 may include Si, AlN, AlGaN, SiC and so on, but are not limited thereto. As for the supporting substrate 101, any material that prevents the plurality of semiconductor layers 30, 40 and 50 from cracking during the removal of the growth substrate and that demonstrates superior heat dissipation performances is suitable, and examples thereof may include SiC, AlSiC, AlN, AlGaN, GaN, sapphire, LTCC (Low Temperature Co-fired Ceramic), HTCC (High Temperature Co-fired Ceramic) and so on. It is preferable to have a buffer layer 200 as in FIG. 1, during the growth of the plurality of semiconductor layers 30, 40 and 50. Next, referring to FIG. 8, the growth substrate 10 is separated and removed from the plurality of semiconductor layers 30, 40 and 50. This removal of the growth substrate 10 can be achieved by laser lift-off, wet etching using a sacrificial layer, grinding, CMP (Chemical-Mechanical Polishing) or the like. Next, referring to FIG. 9, in a wafer level state (This wafer level should be understood as a relative concept to the chip level. Normally, the wafer level indicates a state where the plurality of semiconductor layers 30, 40 and 50 is stacked on the growth substrate 10. However, one should understand that it also includes a state of the plurality semiconductor layers 30, 40 and 50 on the growth substrate 10 cut in a bulk larger than the chip level, prior to the chip level, i.e. before becoming a chip cut into a shape that is practically used.), before being divided into individual chips, the plurality of semiconductor layers 30, 40 and 50 is partly removed and isolated. After this, as shown in FIG. 10, a bonded layer 90 is removed to form a bonded layer-removed surface 102, and the second electrical pass 92 is then exposed. The removal of the bonded layer 90 can be achieved by a well-known dry etching or wet etching process. It is not always required that the removal of the bonded layer 90 should follow the isolation of the plurality of semiconductor layers 30, 40 and 50 into individual chips. For instance, in order to form the bonded layer 90, first, the plurality of semiconductor layers 30, 40 and 50 and the bonded layer 90 may be removed such that a bonded layer-removed surface 102 is formed, and thereafter the plurality of semiconductor layers 30, 40 and 50 can be isolated for individual chips. Referring next to FIG. 11, if necessary, an insulating layer 110 (e.g. $SiO_2$) is provided, and an electrical connection 93 is formed. The electrical connection 93 can be formed by depositing any metal(s) used in a wide variety of semiconductor processes. The bonded layer 90 may be formed by providing a bonding material to the plurality of semiconductor layers 30, 40 and 50 as well as to the supporting substrate 101, or by providing a bonding material to either side. The supporting substrate 101 is perforated and a conductive material is inserted therein, such that the first electrical pass 91 and the second electrical pass 92 are formed. This can be done by electroplating. The first electrical pass 91 and the second electrical pass 92 may continue to the second surface 101b (see FIG. 6) from the first, or they may be exposed as the second surface 101b is grinded.

FIG. 12 is a view illustrating one example of the process of forming an electrical connection according to the present disclosure. Here, a first electrical connection 91 is electrically connected to a first semiconductor layer 30 via a bonded layer 90 such that electrons are transferred to an active layer 40 via the first semiconductor layer 30. A second electrical connection 92 is electrically connected, through an electrical connection 93, to a second semiconductor layer 40 via a first conductive layer 94 such that holes are transferred to the active layer 40 via the second semiconductor layer 50.

As the plurality of semiconductor layers 30, 40 and 50 is removed, the first conductive layer 94 is exposed and electrically connected with the electrical connection 93. The first conductive layer 94 preferably consists of a material which not only spreads current into the second semiconductor layer 50 but also reflects light generated in the active layer 40 towards the first semiconductor layer 30. The first conductive layer 94 can be formed of Au, Pt, Ag, Al, Rh, Cr, Cu, Ta, Ni, Pd, Mg, Ru, Ir, Ti, V, Mo, W, TiW, CuW, ITO, ZnO, $SnO_2$, $In_2O_3$, or an alloy thereof, in a multi-layer (e.g. at least two layer) configuration.

The electrical connection 93 can be formed of Au, Pt, Ag, Al, Rh, Cr, Cu, Ta, Ni, Pd, Mg, Ru, Ir, Ti, V, Mo, W, TiW, CuW or an alloy thereof, in a multi-layer (e.g. at least two layer) configuration.

The bonded layer 90 includes a conductive bonded layer 96 provided onto a supporting substrate 101, and a second conductive layer 95 provided on the side of the plurality of semiconductor layer 30, 40 and 50 and continuing to the first semiconductor layer 30 passing through the second semiconductor layer 50 and the active layer 30. The conductive bonded layer 95 may be comprised of a single material, or have another suitable material for bonding on the side abutting against the conductive bonded layer The conductive bonded layer 95 may be composed of any material(s) forming Ohmic contact with GaN materials and any material(s) serving as a bond, and can be formed of Au, Pt, Ag, Al, Rh, Cu, Ta, Ni, Pd, Ti, V, Mo, W, TiW, CuW, Sn, In, Bi, or an alloy thereof, in a multi-layer (e.g. at least two layer) configuration.

The conductive bonded layer 96 may be composed of any material(s) of excellent adhesion with the supporting substrate and any material(s) serving as a bond, and can be formed of Ti, Ni, W, Cu, Ta, V, TiW, CuW, Au, Pd, Sn, In, Bi, or an alloy thereof, in a multi-layer (e.g. at least two layer) configuration.

Reference numeral 110 and 111 denote insulating layers.

With the above configuration, the entire surfaces of the plurality of semiconductor layers 30, 40 and 50 and the entire surface of the supporting substrate 101 are used for bonding, and these entire surfaces remain in the bonded state even during the removal of the growth substrate 10 (see FIG. 7), such that the plurality of semiconductor layer 30, 40 and 50 can be prevented from cracking. Moreover, the alignment between the first electrical pass 91 and the second electrical pass 92, and the plurality of semiconductor layers 30, 40 and 50 can be carried out without difficulties.

Nevertheless, after the growth substrate 10 is removed, an electrical connection between the second electrical pass 92 and the plurality of semiconductor layers 30, 40 and 50 is required. For this, the bonded layer 90 having already been bonded is removed to form a bonded layer-removed surface 102, and the second electrical pass 92 and the second semiconductor layer 50 are electrically connected using the electrical connection 93. A person skilled in the art should consider that, apart from the present disclosure, it is also possible to form small holes in the second conductive layer 95 or in the conductive bonded layer 96, prior to the formation of the bonded layer 90. Preferably, a rear electrode 120 and a rear electrode 121 are provided onto the second surface 101b of the supporting substrate 101 and connected with the first electrical pass 91 and the second electrical pass 92, such that they can serve as lead frames.

FIG. 13 is a view illustrating another example of the process of forming an electrical connection according to the present disclosure. Here, a first conductive layer 94 and a conductive bonded layer 96 are bonded to form a bonded layer 90, and a second conductive layer 95 and an electrical connection 93 are connected, whereby current is supplied from the second electrical pass 92 to a first semiconductor layer 30.

FIG. 14 is a view illustrating yet another example of the process of forming an electrical connection according to the present disclosure. Here, a conductive bonded layer 96 and a second conductive layer 94 are bonded to form a bonded layer 90. However, only the second conductive layer 94 is involved with bonding, and no current is supplied to a first semiconductor layer 30. A first electric pass 91 is electrically connected with a second semiconductor layer 50, via the bonded layer 90 and a first conductive layer 95. Here, the first conductive layer 95 can serve as a reflective film and/or current spreading layer. The current supply to the first semiconductor layer 30 can be achieved by an electrical connection 93 continuing from a second electrical pass 92 to a growth substrate-removed surface 31.

FIG. 15 is a view illustrating yet another example of the process of forming an electrical connection according to the present disclosure. Here, prior to bonding, a second semiconductor layer 50 and an active layer 40 are removed and thus a mesa surface 32 is formed on a first semiconductor layer 30 in the plurality of semiconductor layers 30, 40 and 50. Once the mesa surface 32 is formed, an isolation process can also be done on the plurality of semiconductor layers 30, 40 and 50 in advance. With this configuration, after the formation of the mesa surface 32, the active layer 40 may have a protective layer (e.g. $SiO_2$; it becomes a part of an insulating layer 110), which in turn would enhance the reliability of the device in the subsequence processes.

FIG. 16 is a view illustrating examples of the form of a growth substrate-removed surface in the semiconductor light emitting device shown in FIG. 12. The growth substrate-removed surface 102 can be formed on one side, two sides (not shown), three sides or the four sides of the semiconductor light emitting device, or can simply be an opening form. To avoid redundancy in explaining, like or similar elements designated by the same reference numerals will not be explained. The electrical connection 93 may be positioned in the growth substrate-removed surface 102, or on the interface separating a chip from another.

FIG. 17 is a view illustrating examples of the form of an electrical connection according to the present disclosure, in which (a) shows that two electrical connections 93 are formed, and (b) and (d) show that a finger electrode 93a is provided to the electrical connection 93. This configuration is applied to the semiconductor light emitting device shown in FIG. 14. In (c), an electric contact 81 is provided by removing an insulating layer 111 to expose a bonded layer 90. By employing the electric contact 81 and the electrical connection 93, probing and sorting can be facilitated during the manufacturing process of a device.

FIG. 18 through FIG. 20 are views illustrating examples of the application of a phosphor in the present disclosure. An encapsulant 1 containing phosphors can directly be applied as shown in FIG. 18; or an encapsulant 2 free of phosphors can be used, with the encapsulant 1 being provided only to the upper part of a semiconductor light emitting device, as shown in FIG. 19; or the encapsulant 2 free of phosphors can be used, with the encapsulant 1 being applied at a certain distance away from the semiconductor light emitting device, as shown in FIG. 20.

Herein below, there will be explained a variety of embodiments of the present disclosures.

(1) A semiconductor light emitting device, comprising: a plurality of semiconductor layers that grows sequentially on a growth substrate, with the plurality of semiconductor layers including a first semiconductor layer having a first conductivity and a growth substrate-removed surface formed on the side thereof, a second semiconductor layer having a second conductivity different from the first conductivity. and an active layer interposed between the first semiconductor layer and the second semiconductor layer, generating light via electron-hole recombination; a supporting substrate having a first surface and a second surface opposite to the first surface, wherein a first electrical pass via which either electrons or holes are transferred to the plurality of semiconductor layers, and a second electrical pass via which either electrons or holes whichever have not been transferred via the first electrical pass are transferred to the plurality of semiconductor layers continue from the second surface to the first surface; a bonded layer, which bonds the second semiconductor layer side of the plurality of semiconductor layers to the first surface side of the supporting substrate and is electrically connected with the first electrical pass; a bonded layer-removed surface formed on the first surface, exposing the second electrical pass and being open towards the plurality of semiconductor layer; and an electrical connection for electrically connecting the plurality of semiconductor layers with the second electrical pass exposed on the bonded layer-removed surface such that either electrons or holes whichever have not been transferred via the first electrical pass are transferred to the plurality of semiconductor layers. Here, the bonded layer means a layer formed after bonding, not any layer to be bonded before bonding which is formed either of the plurality of semiconductors or the supporting substrate.

(2) A semiconductor light emitting device, wherein the first electrical pass is electrically connected to the first semiconductor layer via the bonded layer, and the second electrical pass is electrically connected to the second semiconductor layer via the electrical connection.

(3) A semiconductor light emitting device, further comprising: a first conductive layer which is exposed upon the removal of the plurality of semiconductor layers for connection with the electrical connection, and is electrically connected to the second semiconductor layer. Here, the first conductive layer can be only metal(s) (for examples: Ag, Ni, Ag/Ni) or metal(s) with any metal oxide(s) (for examples: ITO). It usually a reflection function and can be used in combination with a non-conductive structure such as CDR and/or DBR.

(4) A semiconductor light emitting device, wherein the first electrical pass is electrically connected to the second semiconductor layer via the bonded layer, and the second electrical pass is electrically connected to the first semiconductor layer via the electrical connection.

(5) A semiconductor light emitting device, further comprising: a second conductive layer which is exposed upon the removal of the plurality of semiconductor layers for connection with the electrical connection, and is electrically connected to the first semiconductor layer. Here, the second conductive layer functions to supply electricity to the first semiconductor layer and can be used as a part of the bonded layer.

(6) A semiconductor light emitting device, wherein the plurality of semiconductor layers are all covered by the bonded layer, when projected in a direction from the plurality of semiconductor layers to the supporting substrate.

(7) A semiconductor light emitting device, further comprising: an electric contact which is exposed on the opposite side of the supporting substrate with respect to the bonded layer, and interworks with the electrical connection for use in probing of the semiconductor light emitting device.

(8) A method for manufacturing a semiconductor light emitting device, comprising the steps of: preparing a plurality of semiconductor layers that grows sequentially on a growth substrate, with the plurality of semiconductor layers including a first semiconductor layer having a first conductivity and a growth substrate-removed surface being formed on the side thereof, a second semiconductor layer having a second conductivity different from the first conductivity, and an active layer interposed between the first semiconductor layer and the second semiconductor layer, generating light via electron-hole recombination; preparing a supporting substrate having a first surface and a second surface opposite to the first surface, wherein a first electrical pass via which either electrons or holes are transferred to the plurality of semiconductor layers, and a second electrical pass via which either electrons or holes whichever have not been transferred via the first electrical pass are transferred to the plurality of semiconductor layers are provided; bonding the plurality of semiconductor layers side on the opposite side of the growth substrate with the first surface side of the supporting substrate, such that a bonded layer is formed on the bonded region and the first electrical pass is electrically connected to the plurality of semiconductor layers via the bonded layer; removing the substrate; removing the bonded layer so as to expose the second electrical pass; and electrically connecting the second electrical pass with the plurality of semiconductor layer such that either electrons or holes whichever have not been transferred via the first electrical pass are transferred to the plurality of semiconductor layers.

(9) A method for manufacturing a semiconductor light emitting device, wherein the bonded layer removing step includes removing the plurality of semiconductor layers.

(10) A method for manufacturing a semiconductor light emitting device, wherein the step of removing the bonded layer includes isolating the plurality of semiconductor layers for producing individual chips, and removing the bonded layer to expose the second electrical pass.

(11) A method for manufacturing a semiconductor light emitting device, wherein the plurality of semiconductor layers has a conductive layer electrically connected to one of the first and second semiconductor layers, and the method further comprises, prior to the electrical connecting step, the step of removing the plurality of semiconductor layers to expose the conductive layer.

(12) A method for manufacturing a semiconductor light emitting device, wherein the conductive layer is electrically connected to the second semiconductor layer.

(13) A method for manufacturing a semiconductor light emitting device, wherein the conductive layer is electrically connected to the first semiconductor layer.

(14) A method for manufacturing a semiconductor light emitting device, wherein in the electrical connecting step, the second electrical pass continues to the plurality of semiconductor layers having the growth substrate been removed therefrom.

(15) A method for manufacturing a semiconductor light emitting device, wherein prior to the bonding step, a part of the plurality of semiconductor layers is removed.

(16) A method for manufacturing a semiconductor light emitting device, wherein in the bonding step, both the first electrical pass and the second electrical pass are bonded to the bonded layer.

(17) A method for manufacturing a semiconductor light emitting device, wherein in the bonding step, the bonded layer is formed all over the first surface of the supporting substrate.

A semiconductor light emitting device and a method for manufacturing the same according to the present disclosure make it possible to obtain a TFFC (Thin Film Flip Chip)-type semiconductor light emitting device.

Another semiconductor light emitting device and a method for manufacturing the same according to the present disclosure make it possible to obtain a TFFC-type semiconductor light emitting device at the wafer level.

Yet another semiconductor light emitting device and a method for manufacturing the same according to the present disclosure make it possible to accomplish a higher productivity without suffering from cracking of many semiconductor layers during the removal process of a growth substrate as well as in the processes after the removal.

Yet another semiconductor light emitting device and a method for manufacturing the same according to the present disclosure make it possible to accomplish a wafer-level TFFC-type semiconductor light emitting device featuring an easier alignment of electrodes.

What is claimed:

1. A method for manufacturing a semiconductor light emitting device comprising:
    a plurality of semiconductor layers grown sequentially on a growth substrate, with the plurality of semiconductor layers including a first semiconductor layer having a first conductivity and a growth substrate-removed surface formed on a side thereof, a second semiconductor layer having a second conductivity different from the first conductivity, and an active layer interposed between the first semiconductor layer and the second semiconductor layer, generating light via electron-hole recombination;
    a supporting substrate preventing the plurality of semiconductor layers from cracking during the removal of the growth substrate and having a first surface and a second surface opposite to the first surface, wherein a first electrical pass via which either electrons or holes are transferred to the plurality of semiconductor layers, and a second electrical pass via which either electrons or holes whichever have not been transferred via the first electrical pass are transferred to the plurality of semiconductor layers, continue from the second surface to the first surface;

a bonded layer, which bonds the second semiconductor layer side of the plurality of semiconductor layers to the first surface side of the supporting substrate and is electrically connected with the first electrical pass, the bonded layer formed as a result of bonding the second semiconductor layer side of the plurality of semiconductor layers to the first surface side of the supporting substrate;

a bonded layer-removed surface formed on the first surface, exposing the second electrical pass and open towards the plurality of semiconductor layers with the bonded layer which is bonded with the plurality of semiconductors removed;

an electrical connection for electrically connecting the plurality of semiconductor layers with the second electrical pass exposed on the bonded layer-removed surface such that either electrons or holes whichever have not been transferred via the first electrical pass are transferred to the plurality of semiconductor layers; and a conductive layer exposed upon the removal of the plurality of semiconductor layers for connection with the electrical connection, the method comprising the steps of:

bonding the plurality of semiconductor layers side on the opposite side of the growth substrate with the first surface side of the supporting substrate, such that the first electrical pass is electrically connected to the plurality of semiconductor layers via the bonded layer;

removing the growth substrate;

removing the bonded layer to expose the second electrical pass; and electrically connecting the second electrical pass with the plurality of semiconductor layers by the electrical connection, wherein the step of removing the bonded layer includes exposing the conductive layer by removing the plurality of semiconductor layers for connection with the electrical connection, wherein the electrical connection is electrically connected with the plurality of semiconductor layer via the conductive layer, and wherein the conductive layer is formed prior to the step of bonding and is positioned between the plurality of semiconductor layers and the bonded layer with the second electrical pass electrically connected via the electrical connection and the conductive layer to the plurality of semiconductor layers.

2. The method for manufacturing a semiconductor light emitting device of claim 1, wherein the first semiconductor layer, the active layer and the second semiconductor layer are Group III-nitride semiconductor materials.

3. The method for manufacturing a semiconductor light emitting device of claim 1, wherein the first electrical pass is electrically connected to the first semiconductor layer via the bonded layer, and the second electrical pass is electrically connected to the second semiconductor layer via the electrical connection and the conductive layer.

4. The method for manufacturing a semiconductor light emitting device of claim 1, wherein the plurality of semiconductor layers are all covered by the bonded layer, when projected in a direction from the plurality of semiconductor layers to the supporting substrate.

* * * * *